United States Patent [19]

Ina

[11] Patent Number: 5,323,207
[45] Date of Patent: Jun. 21, 1994

[54] PROJECTION EXPOSURE APPARATUS
[75] Inventor: Hideki Ina, Kawasaki, Japan
[73] Assignee: Canon Kabushiki Kaisha, Tokyo, Japan
[21] Appl. No.: 8,830
[22] Filed: Jan. 25, 1993

Related U.S. Application Data

[63] Continuation of Ser. No. 516,721, Apr. 30, 1990, abandoned.

[30] Foreign Application Priority Data

May 2, 1989 [JP] Japan .................................. 1-112978

[51] Int. Cl.⁵ .............................................. G03B 27/52
[52] U.S. Cl. .......................................... 355/53; 355/43; 356/401; 250/236
[58] Field of Search ........................... 355/43, 53, 77; 356/400, 401; 250/234, 235, 236, 548, 557

[56] References Cited

U.S. PATENT DOCUMENTS

| | | | |
|---|---|---|---|
| 3,853,398 | 12/1974 | Kano | 355/43 |
| 4,127,777 | 11/1978 | Binder | 250/548 |
| 4,251,129 | 2/1981 | Suzki et al. | 350/91 |
| 4,262,208 | 4/1981 | Suzki et al. | 250/548 |
| 4,383,757 | 5/1983 | Phillips | 355/53 |
| 4,395,117 | 7/1983 | Suzuki | 355/43 |
| 4,406,546 | 9/1983 | Suzuki | 356/400 |
| 4,540,278 | 9/1985 | Phillips | 355/55 |
| 4,645,924 | 2/1987 | Suzuki et al. | 250/236 |
| 4,650,983 | 3/1987 | Suwa | 250/204 |
| 4,748,333 | 5/1988 | Mizutani et al. | 250/561 |

Primary Examiner—Michael L. Gellner
Assistant Examiner—Khanh Dang
Attorney, Agent, or Firm—Fitzpatrick, Cella, Harper & Scinto

[57] ABSTRACT

A projection exposure apparatus includes a first stage for supporting a first object; a second stage for supporting a second object; a projection optical system for projecting an image of the first object onto the second object; an image pickup system having a predetermined image pickup surface and being arranged to illuminate a mark of the first object with a radiation beam such that, with a reflected beam from the first object resulting from the illumination, a first image of the mark of the first object is projected onto the image pickup surface and that, with a reflected beam from the second object resulting from the illumination and being directed to the image pickup surface through the first object, a second image of the mark of the first object is projected onto the image pickup surface; and a detecting device cooperable with the image pickup system, for detecting a deviation of the surface of the second object with respect to a plane on which the image of the first object is to be focused, on the basis of any positional deviation between the first and second images projected onto the image pickup surface.

18 Claims, 4 Drawing Sheets

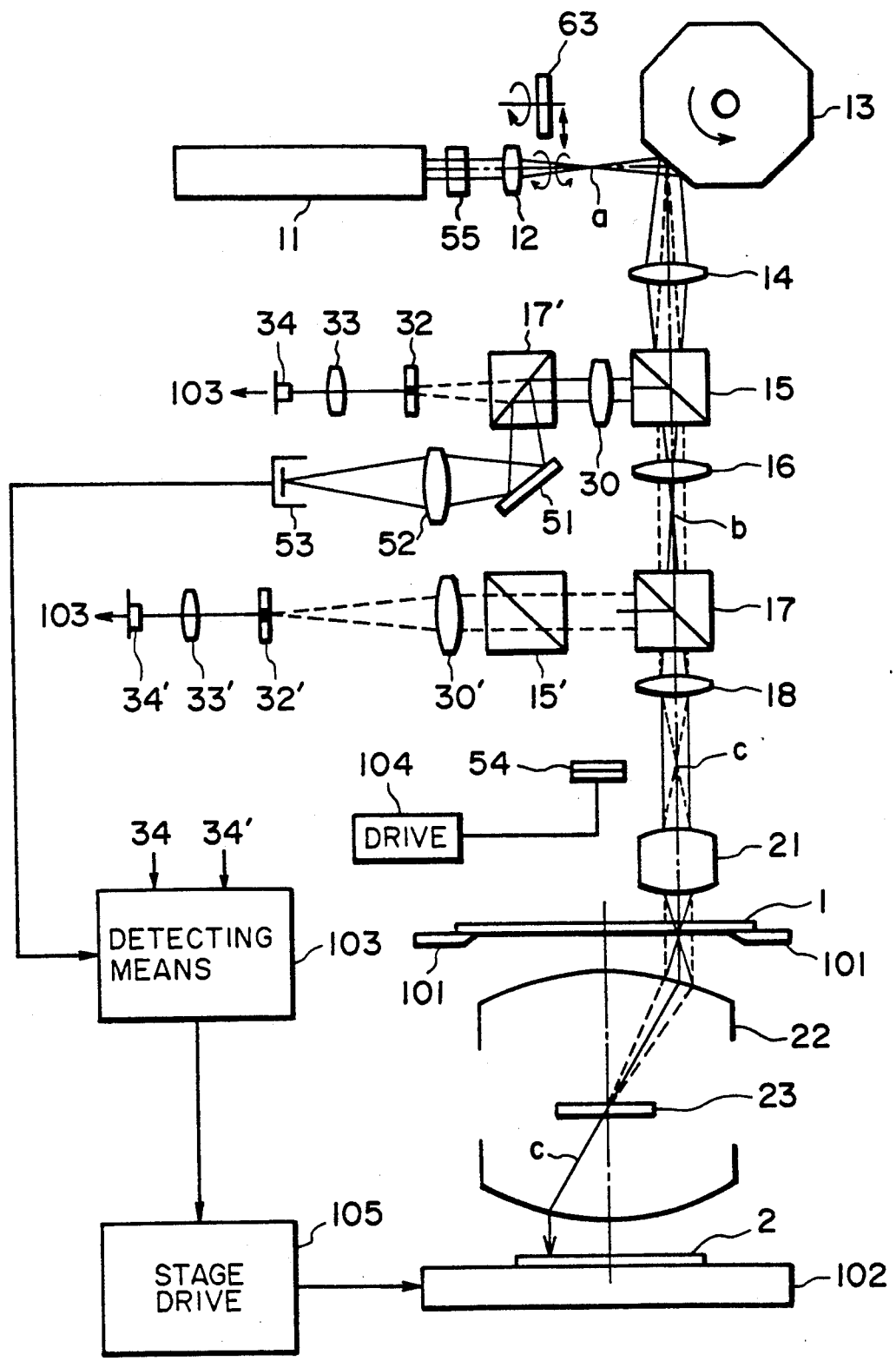

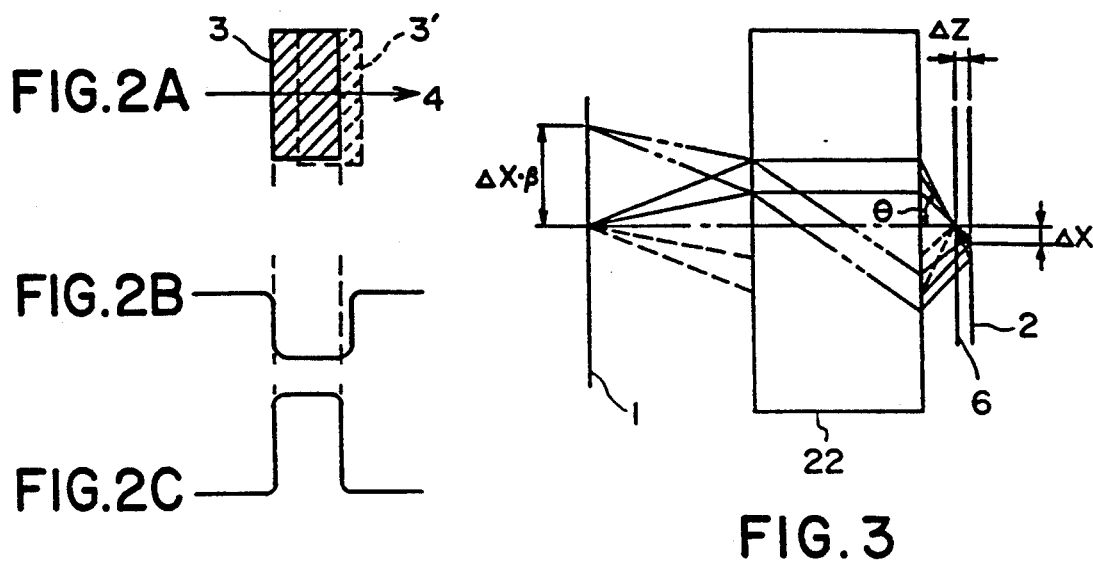
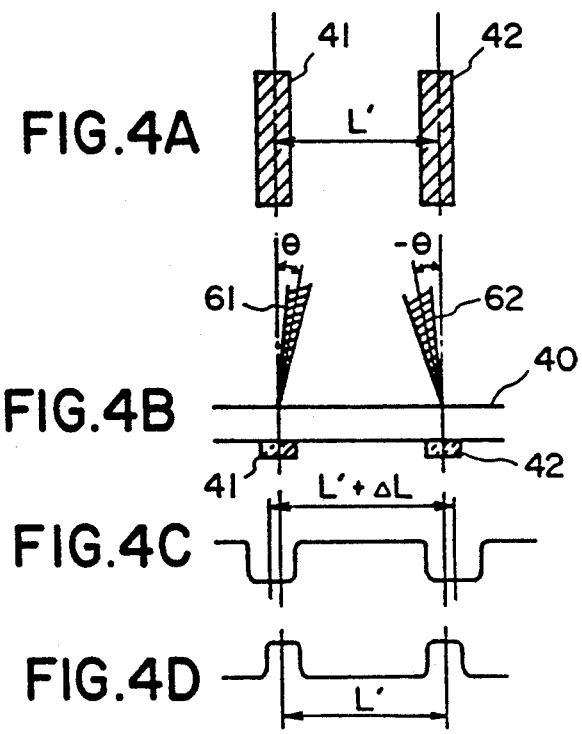

PROJECTION EXPOSURE APPARATUS

This application is a continuation of prior application Ser. No. 07/516,721 filed Apr. 30, 1990, now abandoned.

FIELD OF THE INVENTION AND RELATED ART

This invention relates to a projection exposure apparatus and, more particularly, to a projection exposure apparatus for projecting an image of a first object, such as a reticle having a circuit pattern, onto a second object such as a semiconductor wafer through a projection optical system and having a function for detecting any deviation of the surface of the second object with respect to a plane on which the image of the first object is to be focused.

Projection type exposure apparatuses prevail in the field of the manufacture of semiconductor devices such as microcircuits. In order to assure that very fine circuit patterns are reproduced on a semiconductor wafer with such a projection exposure apparatus, to meet further increases in the degree of integration of each semiconductor chip, the projection exposure apparatus should have a high-precision aligning function for correctly aligning the semiconductor wafer with a reticle (photomask) (to avoid pattern overlay errors during successive wafer processes) and a high-precision focusing function for correctly positioning the wafer with respect to an image plane of a projection optical system (to ensure that a sharp image of a circuit pattern is formed on the wafer).

As regards the reticle-to-wafer aligning function, proposals have been made in U.S. Pat. Nos. 3,853,398, 4,251,129, 4,262,208, 4,406,546 and 4,645,924 all assigned to the same assignee of the subject application. As regards the focusing function, on the other hand, a proposal has been made in U.S. Pat. No. 4,395,117 also assigned to the same assignee of the subject application. The last-mentioned U.S. patent discloses what can be called a "TTL (through the lens) focusing system" by which any deviation of the surface of a semiconductor wafer with respect to an image plane of a projection optical system can be detected with good precision by using the projection lens system.

SUMMARY OF THE INVENTION

It is an object of the present invention to provide a novel and improved method, usable in a projection exposure apparatus for projecting an image of a first object such as a reticle onto a second object such as a semiconductor wafer, for detecting any deviation of the surface of the second object with respect to a plane on which the image of the first object is to be focused.

It is another object of the present invention to provide a projection exposure apparatus for projecting an image of a first object such as a reticle onto a second object such as a semiconductor wafer, wherein the projection exposure apparatus has a novel and improved TTL type of focusing function for detecting any deviation of the surface of the second object with respect to a plane on which the image of the first object is to be focused.

In accordance with an aspect of the present invention, to achieve at least one of these objects, there is provided a method, usable in a projection exposure apparatus for projecting an image of a first object onto a second object through a projection optical system, for detecting a deviation of a surface of the second object with respect to a plane on which the image of the first object is to be focused, said method comprising the steps of: illuminating a mark of the first object; forming a first image of the mark of the first object by use of a beam reflected from the first object; forming a second image of the mark of the first object by use of a beam reflected from the second object and directed through the projection optical system and the first object; and detecting a deviation of the surface of the second object with respect to said plane, on the basis of any relative positional deviation between the first and second images of the mark.

In accordance with another aspect of the present invention, there is provided a projection exposure apparatus, comprising: a first stage for supporting a first object; a second stage for supporting a second object; a projection optical system for projecting an image of the first object onto the second object; an image pickup system having a predetermined image pickup surface and being arranged to illuminate a mark of the first object with a radiation beam such that, with a reflected beam from the first object resulting from the illumination, a first image of the mark of the first object is projected onto said image pickup surface and that, with a reflected beam from the second object resulting from the illumination and being directed to said image pickup surface through the first object, a second image of the mark of the first object is projected onto said image pickup surface; and detecting means cooperable with said image pickup system, for detecting a deviation of the surface of the second object with respect to a plane on which the image of the first object is to be focused, on the basis of any positional deviation between the first and second images projected onto said image pickup surface.

In one preferred form of the present invention, the image pickup system operates to project the first and second images onto the image pickup surface sequentially. This facilitates detection of the first and second images independently of each other when the first and second images are projected onto one and the same image pickup surface, thus assuring accurate detection of the positions of the first and second images. As a matter of course, two separate image pickup surfaces may be provided so that the first image is projected onto one of the two image pickup surfaces while the second image is projected onto the other image pickup surface.

In one preferred form of the present invention, the projection optical system is telecentric both on the first object side and on the second object side. On this occasion, the image pickup system may be arranged to direct the radiation beam to the mark in a direction inclined with respect to the optical axis of the projection optical system. Alternatively, the projection optical system may be one which is telecentric only on the second object side, but not telecentric on the first object side. On this occasion, while the image pickup system may be arranged to direct the radiation beam to the mark in a direction inclined with respect to the optical axis of the projection optical system, alternatively, it may be arranged to direct the radiation beam to the mark along the optical axis of the projection optical system.

The radiation beam to be used with the image pickup system of the projection exposure apparatus is not limited to a specific type. However, when the projection optical system is provided by a lens system, preferably a monochromatic light is used as the radiation beam. In this respect, in accordance with one preferred form of the present invention, a laser beam is used as the radiation beam. When the projection optical system is provided by a mirror system, there does not arise a problem of chromatic aberration and, therefore, any one of radiation beams of various wavelengths and bandwidths can be utilized.

In a projection exposure apparatus according to an aspect of the present invention, for projection of the second image, a reflected beam from the second object resulting from the impingement of a radiation beam passed through the first object and the projection optical system against the second object, is used. As for the second object, a semiconductor wafer itself or a mirror separately provided on a second stage, may be used.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic views, respectively, showing a major portion of a projection exposure apparatus according to an embodiment of the present invention.

FIGS. 2A through 2C and FIG. 3 are schematic views, respectively, for explaining the principle of detecting a deviation of the surface of a semiconductor wafer with the structure shown in FIGS. 1A and 1B.

FIGS. 4A through 4D are schematic views showing a modification of the structure shown in FIGS. 1A and 1B.

DESCRIPTION OF THE PREFERRED EMBODIMENTS

Figure 1B:
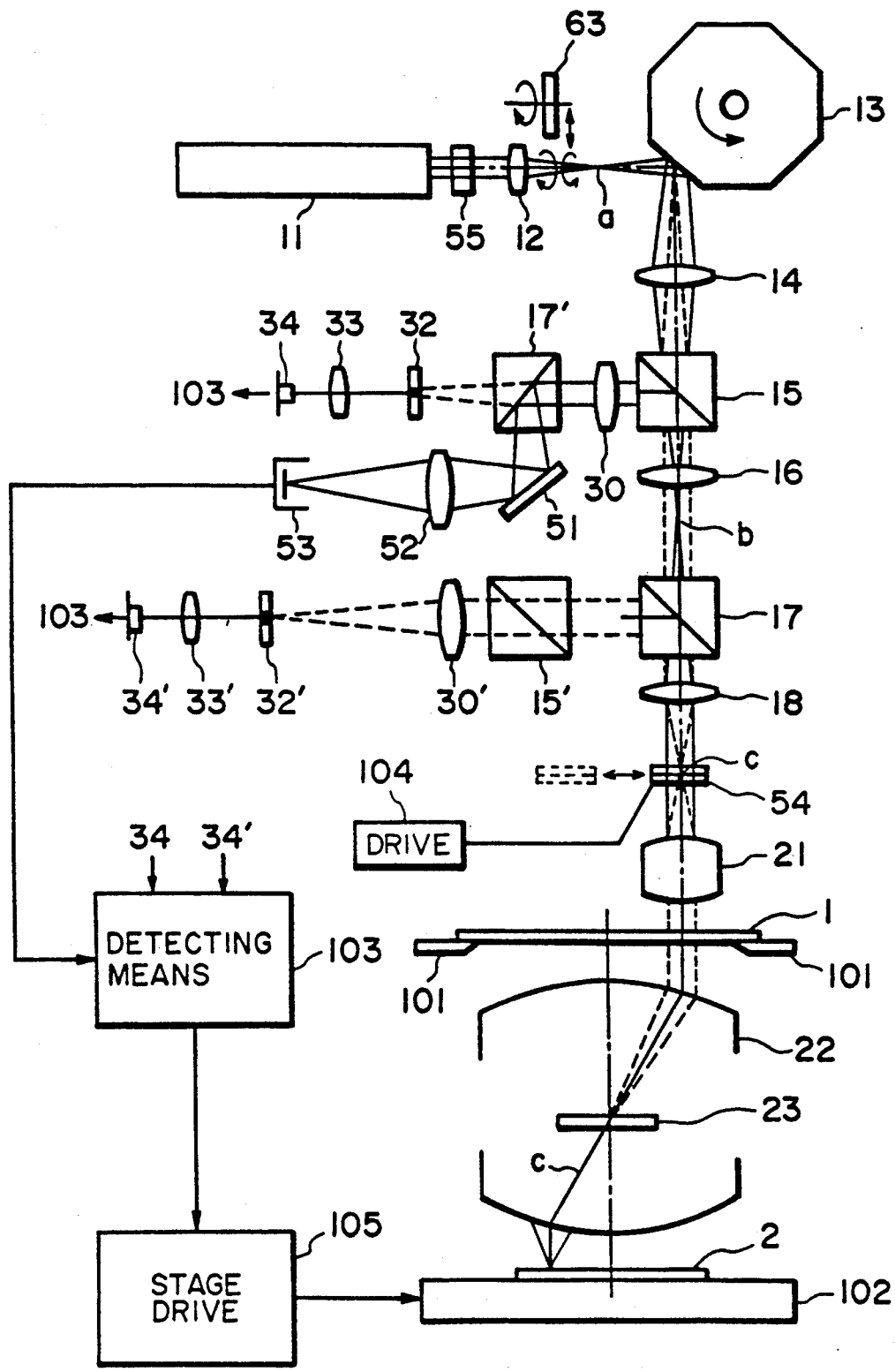

Referring to FIGS. 1A and 1B, there is shown a step-and-repeat type projection exposure apparatus for the manufacture of semiconductor devices, according to an embodiment of the present invention. The apparatus includes an illumination unit (not shown) for supplying radiation energy with which a circuit pattern of a reticle 1 is illuminated. Projection lens system 22 projects an image of the illuminated circuit pattern onto a semiconductor wafer 2, by which the image (circuit pattern) is transferred to a resist applied to the semiconductor wafer 2.

In FIGS. 1A and 1B, the system comprising the elements denoted by reference numerals 11, 12, 13, 14, 15, 15', 16, 17, 18, 21, 23, 30, 30', 32, 32', 33, 33', 34 and 34' is the one for detecting alignment marks of the reticle 1 and the wafer 2 in a dark field. More specifically, the detecting system includes an HeCd laser 11; lenses denoted at 12, 14, 16, 18, 21, 30, 30', 33 and 33'; a rotatable polygonal mirror 13; polarization beam splitters 15 and 15'; a beam splitter 17 comprising a half mirror; a quarter waveplate 23; spatial filters 32 and 32'; and photodetectors 34 and 34'. The principle of alignment mark detection through this dark-field detecting system is essentially the same as that of the detecting system disclosed in the aforementioned U.S. Pat. Nos. 4,251,129, 4,262,208 and 4,406,546, and therefore details are not explained here.

Denoted at reference numeral 55 is a stop having an aperture (slit) formed at a position which is eccentric with respect to the optical axis; at 63 is a diffusing plate which is rotatable or swingable about an axis parallel to the optical axis; at 51 is a deflecting mirror; at 52 is a lens; at 53 is an image pickup device which comprises a CCD; at 54 is a quarter waveplate; at 104 is a driving mechanism for removably introducing the quarter waveplate 54 into the optical path between the lenses 18 and 21; and at 103 is a detecting means for processing video signals outputted from the image pickup device 53 to detect any deviation of the wafer 2 surface from a plane on which the image of the circuit pattern of the reticle 1 is to be focused.

Denoted at 101 is a movable reticle stage for supporting the reticle 1; at 102 is a movable wafer stage for supporting the wafer 2; and at 105 is a stage driving means for moving the wafer stage 102 in the direction of the optical axis of the projection lens system 22 and along a plane perpendicular thereto.

In the present embodiment, light of a g-line is used as exposure energy for projection of the image of the circuit pattern of the reticle 1, and the projection lens system 22 is aberration-corrected with respect to the g-line. On the other hand, an He-Cd laser emits laser light of a wavelength which is very close to the g-line. Therefore, also with respect to this laser light, substantially no aberration is produced by the projection lens system 22.

In addition to the circuit pattern, the reticle 1 is provided with a chromium mark pattern or patterns to be used for detection of any deviation of the wafer 2 surface and alignment marks to be used for the reticle-to-wafer alignment. The mark patterns and the alignment marks are formed on the same surface on which the circuit pattern is formed. On the other hand, the wafer 2 has circuit patterns and alignment marks formed in the preceding process or processes, and a resist is applied to the wafer to cover them.

In the optical arrangement shown in FIGS. 1A and 1B, the stop 55, the reflection surface of the rotatable polygonal mirror 13 and the pupil of the projection lens system 22 are at positions which are optically conjugate with each other. Also, the mark pattern of the reticle 1 and the image pickup surface of the image pickup device 53 are set at positions which are optically conjugate with each other. The lens 21 is an objective lens which is telecentric on the reticle 1 side and has a focal surface which coincides with the pattern bearing surface of the reticle 1 (the surface on which the circuit pattern on the mark is formed).

Referring particularly to FIG. 1A, the manner in which to detect the image of the mark pattern of the reticle 1 will now be explained. The laser light a emitted from the laser 11 passes through the aperture of the stop 55 and is concentrated by the lens 12. Then, the laser light is reflected by the rotating polygonal mirror 13, and thereafter, it passes through the lens 14 and the polarization beam splitter 15, whereby it is transformed into a polarized light b (P-polarized light). In the present embodiment, the laser 11 comprises a linear polarization type He-Cd laser, and the laser light emitted therefrom has a direction of polarization co-directional with that of the polarization beam splitter 15. This provides a system of good efficiency with respect to the light utilization.

Denoted at 63 is a rotatable diffusing plate for diffusing the laser light to illuminate the reticle 1 with diffused light. The diffusing plate is used to reduce the effect of "speckle" when the image of the mark pattern is picked up by the image pickup device. The manner of using such a diffusing plate and the function thereof are described in detail in the aforementioned U.S. Pat. No. 4,645,924. Although in FIG. 1A the diffusing plate 63 is illustrated as being at a position out of the path of the laser light, in use, it is placed on the path of the laser light.

As described hereinbefore, the stop 55 has a slit-shaped aperture which is eccentric with respect to the optical axis. The stop 55 is provided at a position optically conjugate with the point of reflection of the rotatable polygonal mirror 13 which point is at a pupil position of the illustrated optical system. The stop 55 serves to direct, to the lens 12, only a portion of the laser light emitted from the laser 11 (in this example, the portion of the laser light below the optical axis). This ensures that, through the objective lens 21, the mark pattern of the reticle 1 is illuminated with the laser light projected in a direction inclined with respect to the optical axis. Details of this will be described later.

The polarized light b from the polarization beam splitter 15 passes through the field lens 16, the beam splitter 17, the relay lens 18 and the objective lens 21, and it illuminates the mark pattern of the reticle 1. A portion of the light is directly reflected by the reticle 1 and goes back to the optical elements having been passed thereby. This reflection light has a direction of polarization unchanged as the light impinges on the reticle 1. Accordingly, when the reflection light reflected from the reticle 1 returns to the polarization beam splitter 15, the direction of polarization is unchanged as the light has passed therethrough to the reticle 1. As a result, the reflection light passes through the polarization beam splitter 15, and is not directed to the image pickup device 53 used in the present invention.

On the other hand, a portion of the light impinging on the reticle 1 passes therethrough and enters into the projection lens system 22. As illustrated, a quarter waveplate 23 is provided within the projection lens system 22, adjacent to a position corresponding to the pupil plane thereof (usually, a stop is provided). The light transmitted through the reticle 1 goes through the quarter waveplate 23, by which it is transformed into a circularly polarized light c. The circularly polarized light c is projected to the wafer 2 and is reflected by the wafer 2 surface. The reflected light goes through the quarter waveplate 23 again, by which it is transformed into a linearly polarized light. Here, the light passing twice through the quarter waveplate has a direction of polarization which is rotated by 90 degrees from the direction of the light that has impinged on the reticle 1. Namely, an S-polarized light is produced.

Accordingly, as the reflection light from the wafer 2 goes backwardly through the optical system and impinges again on the polarization beam splitter 15, the direction of polarization thereof is that of the S-polarized light. As a result, the reflection light from the wafer 2 is reflected by the polarization beam splitter 15. The light reflected by the polarization beam splitter 15 is reflected again by the beam splitter 17' and, after passing through the erector lens 52, it is projected onto the image pickup device 53. By this, an image of the mark pattern of the reticle 1 is formed on the image pickup surface of the image pickup device 53. The beam splitter 17' serves as a branch for an alignment mark detecting photoelectric detection system comprising the element 32 and the elements following it and for the image pickup system comprising the element 51 and the elements following it. By replacing the beam splitter 17' by a swingable mirror, it is possible to provide a system having a smaller loss in light quantity.

As described, in this embodiment, the reticle 1 is observed through the image pickup device 53 by using polarization, with the reticle 1 being illuminated by the light reflected from the wafer 2. FIG. 2 shows the image of the mark pattern of the reticle 1 illuminated in this manner, as formed on the image pickup device 53.

Referring to FIGS. 2A through 2G, the principle of detection according to the present invention will be explained. FIG. 2A shows the state of reticle 1 being observed. Solid line 3 depicts the mark pattern of the reticle 1, and arrow 4 depicts the scan line by the image pickup device. In the detection system shown in FIG. 1, the reflected light from the chromium portion of the mark pattern 3 of the reticle 1 passes through the polarization beam splitter 15 as described hereinbefore, and does not come to the image pickup device 53. As a result, the signal is low in level.

On the other hand, the light impinging on a portion of the reticle 1 other than the mark pattern 3 and having no chromium coating, goes through the projection lens system 22 and impinges on the wafer 2. The impinging light is reflected by the wafer 2 and thereafter it again passes through the projection lens system 22. As a result, under the influence of the quarter waveplate 23, the direction of polarization is rotated by 90 degrees. Consequently, the reflection light from the wafer 2 as it comes back to the polarization beam splitter 15 is reflected by this polarization beam splitter 15 and is directed to the image pickup device 53. Thus, the image pickup device 53 produces a video signal corresponding to the image formed by the light from the portion around the mark pattern 3. This is the basic function of the optical system shown in FIG. 1.

In the present embodiment, any shift in the positional relationship between the reticle 1 and the wafer 2 which should be placed in an optically conjugate relationship, is detected by use of the imaging of the mark pattern 3 of the reticle 1 through the projection lens system 22. To this end, in the present embodiment, the elements of the optical arrangement are disposed so that the laser light is projected onto the wafer 2 surface in a direction inclined with respect to the optical axis of the projection lens system 22, and by using the reflection light from the wafer 2 surface, the image of the mark pattern is observed.

Next, the function of the present embodiment will be explained with reference to an example wherein a projection lens system 22 having a numerical aperture (NA) of 0.48 is used. Here, NA=0.48 means that, since sin 28.67 (deg)=0.48, the maximum integration angle of the marginal ray of the imaging light impinging on the wafer 2 surface is 28.67 (deg).

In this example, the laser light is projected to the wafer 2 surface with an angle of incidence of 25 ±3.7 deg. Since the projection lens system 22 is arranged so that the principle light ray is perpendicular on the wafer 2 surface side, the zero-th order reflection light after being reflected by the wafer surface is directed in a direction within a range of −25±3.7 deg.

In the present embodiment, under the described condition, any shift of the conjugate relationship between the reticle 1 and the wafer 2 can be detected.

It is now assumed that, as shown in FIG. 3, the surface of the wafer 2 is deviated by $\Delta Z$ from the best focus plane 6 of the image of the pattern of the reticle 1. In the present embodiment, the observation of the image is performed through the image pickup device 53. The observation of the image of the pattern of the reticle 1, reflected by the wafer 2 surface, is consequently performed at the position 6 optically conjugate with the reticle 1 surface, set as a focus plane with respect to the image pickup device 53. Here, if the central ray of the laser light is inclined by 25 deg. with respect to the optical axis, the image of the mark pattern of the reticle 1 as formed by the reflection light from the wafer 2 shifts by $\Delta X = 2 \cdot \Delta Z \cdot \tan 25$ (deg) as measured on the wafer 2 side. Since $\tan 25$ (deg)=0.466, such a shift $\Delta X \approx 0.93 \Delta Z$. Thus, from the measured value of the shift $\Delta X$, the focus error $\Delta Z$ can be calculated. Accordingly, the measurement precision for the shift $\Delta X$ directly corresponds to the measurement precision for the focus error $\Delta Z$.

In FIG. 2A, the image of the reticle 1 as actually observed through the image pickup device 53 corresponds to the superposition of the image 3' of the mark pattern of the reticle 1 as formed by the reflection light from the wafer 2 (as having been explained hereinbefore) and the real mark pattern 3 actually provided on the reticle surface. Namely, on the reticle 1, there are an actual mark pattern and an image 3' of this mark pattern, shifted by $\Delta X$ (as measured on the wafer side) due to the effect of defocusing ($\Delta Z$), and both of them are observed at the same time. FIG. 2B shows the video signal obtainable in this case from the image pickup device 53.

In FIG. 2B, the left-hand edge of the signal corresponds to the edge as formed by the image of the mark pattern 3, because of shading of the reflected light from the wafer 2 due to the presence of the actual mark pattern 3.

On the other hand, the right-hand edge of this signal is determined by the mark pattern image 3' shifted outwardly of the mark pattern 3 position. Since, usually, the amount of shift $\Delta X$ is not so large, it is not possible to separate the signal components of the video signal corresponding to the pattern 3 and the image 3'. Thus, the signal detection is executed with these signal components mixedly contained in the video signal. Thus, as seen from FIG. 2B, the central position of the image of the mark pattern of the reticle, as detectable is deviated by $\Delta X/2$ from the center of the mark pattern 3 of the reticle 1.

FIG. 2C shows a video signal obtained when the image as formed by the reflection light from the reticle 1 is detected through the image pickup device 53. The optical arrangement for executing such a detection is illustrated in FIG. 1B.

An important feature of the FIG. 1B arrangement resides in placing a quarter waveplate 54 between the relay lens 18 and the objective lens 21 of the FIG. 1A structure, at a position optically conjugate with the pupil plane of the projection lens system. This can be done by moving the quarter waveplate 54 by means of the driving mechanism 104. By the action of this quarter waveplate 54, the linearly polarized light (P-polarized light) b passed through the polarization beam splitter 15 is transformed into a circularly polarized light as the former passes through the quarter waveplate 54. The light directly reflected from the reticle 1 again goes through the quarter waveplate 54 and is transformed into a linearly polarized light (S-polarized light) perpendicular to that as initially incident thereon. Accordingly, as the reflection light from the reticle 1 impinges again on the polarization beam splitter 15, it is reflected by this polarization beam splitter toward the image pickup device 53.

On the other hand, the light having passed through the reticle 1 and the projection lens system 22, having been reflected by the wafer 2 and having passed again through the projection lens system 22 and the reticle 1 back to the optical system, has passed by each of the quarter waveplates 54 and 23 twice. As a result, the direction of polarization of the light impinging again on the polarization beam splitter 15 is the same as that of the light initially impinging on the quarter waveplate 54. Accordingly, the reflected light from the wafer 2 impinging again on the polarization beam splitter 15 is not reflected by the polarization beam splitter 15, but is transmitted. Thus, it is not received by the image pickup device 53. Namely, in the arrangement of FIG. 1B, the mark pattern 3 of the reticle 1 is detected only by the light directly reflected by the reticle 1.

As described hereinbefore, what is illustrated in FIG. 2C is the video signal which corresponds to the image of the mark pattern of the reticle 1 as obtainable from the image pickup device 53 in this case. As compared with the signal shown in FIG. 2B, the portion of the signal corresponding to the chromium surface of the mark pattern 3 is high in level, and the edges as detected correspond to the edges of the mark pattern 3 actually present on the reticle 1.

Since the detection of the mark pattern 3 with the FIG. 1B arrangement does not use the reflection light from the wafer 2, it is not at all influenced by the effect of the position of the wafer 2.

On the other hand, when the reflection light produced at the wafer 2 is used to detect the mark pattern 3, the center of the image of the mark pattern is shifted as shown in FIG. 2B, in accordance with the wafer 2 position, namely, in accordance with the amount of defocus of the wafer 2 surface.

If $\Delta Z = 0$, that is, if the wafer 2 surface is exactly at the focus position of the image of the pattern of the reticle 1, the amount of shift $\Delta X$ becomes equal to zero. This means that, when $\Delta Z = 0$, the position of the center of the image of the mark pattern 3 of the reticle 1 as formed by the light reflected by the reticle 1, as shown in FIG. 2C, coincides with the position of the center of the image of the mark pattern 3 of the reticle 1 as formed by the light reflected by the wafer 2, as shown in FIG. 2B, although the respective signals have inverted waveforms. Accordingly, if the position on the image pickup device 53 of the image of the mark pattern 3 formed by the light reflected by the reticle 1 is memorized first and then the position of the image of the mark pattern 3 formed by the light reflected by the wafer 2 is detected and if any positional deviation therebetween on the image pickup device 53 is detected, then it is possible to detect any deviation between the wafer 2 surface and the best focus plane of the image of the pattern of the reticle 1.

Detecting means 103 operates to detect any relative positional deviation between these two images, on the basis of the video signals outputted sequentially from the image pickup device 53, and operates to calculate the amount of deviation of the wafer 2 surface from the plane on which the image of the pattern of the reticle 1 is focused. Then, the detecting means 103 supplies a signal corresponding to the detected focus error to the stage driving means 105.

In response to the thus supplied signal, the driving means 105 moves the wafer stage 102 along the optical axis of the projection lens system 22 so as to position the wafer 2 surface at the focus plane as described.

The detecting means 103, the stage driving means 105 and the wafer stage 102 used in the present embodiment for the focusing operation also can be used for the alignment of the reticle 1 and the wafer 2. To this end, the signals from the photodetectors 34 and 34', corresponding to the alignment marks of the reticle 1 and the wafer 2, are supplied to the detecting means 103 along signal lines, not shown. As a matter of course, the detecting means 103 is provided with a processing circuit for determining relative positional deviation between the reticle 1 and the wafer 2 on the basis of the thus supplied signals.

In the present embodiment, what is necessary is that the wafer 2 has a function for reflecting light. It is not necessary to provide a specific pattern on the wafer 2 surface. For this reason, with the device of the present embodiment, even in the first mask process, it is possible to measure the positional deviation of the wafer 2 surface, in a manner similar to that of the detection to be made in the second mask process and so on.

In the arrangement shown in FIG. 1B wherein the mark pattern 3 is detected only by using the light reflected by the reticle 1, the objective lens 21 comprises an infinitely corrected lens. Thus, the light passed through the objective lens 21 and impinging on the quarter waveplate 54 is a parallel light. With this structure, even if the quarter waveplate 54 inserted to detect the reflection light from the reticle 1 through the image pickup device 53 is inclined relative to a plane perpendicular to the optical axis, there does not occur shift of the image on the image pickup device 53. Usually, the quarter waveplate 54 is made by a crystal plate with parallelism of a second order. Accordingly, even if the quarter waveplate 54 is inclined slightly as a result of the insertion, the angle of the light is unchanged. Only lateral shift occurs. Thus, the position of the image of the mark pattern 3, formed at the focal point position of the relay lens 18 is unchanged.

As an alternative, the mark pattern of the reticle may be provided by a plurality of pattern elements, and the spacing or spacings of the images of these pattern elements as formed by the light reflected by the reticle are compared with the spacing or spacings of the images of these pattern elements as formed by the light reflected from the wafer. From the difference therebetween, the state of defocus of the wafer surface can be detected. Namely, also on this occasion, when the measured value with regard to the pattern images formed by the light reflected from the wafer becomes equal to the measured value with regard to the pattern images formed by the light reflected by the reticle, the wafer is at the best focus position. On this occasion, since the spacing or spacings of the images of the pattern elements bear the defocus information, it is not necessary to memorize the absolute position of the pattern image on the image pickup device 53, as in the foregoing embodiments.

Namely, since comparison should be made only of the ratio of the spacing of the images of the pattern elements as formed by the reflection light from the reticle and the spacing of the images of the patterns formed by the reflection light from the wafer, it is only necessary to memorize the spacing of the images of the patterns.

FIG. 4 shows an embodiment wherein the mark pattern of the reticle 1 comprises two linear patterns. As shown in FIG. 4A, linear patterns 41 and 42' spaced by a predetermined interval L' are illuminated with lights 61 and 62, in directions inclined by $\pm\theta$ deg., respectively. Here, at the patterns 41 and 42, these lights are inclined in different directions.

When, as in the present embodiment, the angle of illuminating light should be changed in accordance with the position on the reticle 1 to be illuminated, the stop 50 shown in FIG. 1 is disposed with a deviation from the pupil position of the illustrated optical system or the position conjugate with the pupil. For example, it may be provided at a position which is not optically conjugate with the point of reflection of the rotatable polygonal mirror 13. As described with reference to the foregoing embodiments, when the mark pattern of the reticle 1 is to be detected by using the reflection light from the wafer, it may be made in the following manner. If the wafer 2 is defocused to some extent, the signal from the image pickup device 53 is such as illustrated in FIG. 4C, wherein the distance between the linear patterns 41 and 42 reflects the presence of a difference in angle between the lights illuminating these patterns, and is measured as a distance $L'+\Delta L$, shifted from the distance $L'$. From this value, like the case described hereinbefore, the amount of defocus of the wafer 2 can be detected by using the inclination angles $\pm\theta$ (deg.) of the lights 61 and 62. If, as compared therewith, the reflection light from the reticle 1 is used, a signal such as shown in FIG. 4D is obtained and the distance $L'$ can be detected correctly. By observing the image formed by the reflection light from the reticle 1, it is possible to correct any magnification error, for example, of the optical system and also to calibrate the distance $L'$.

When the mark pattern of the reticle 1 comprises three or more pattern elements, if the illumination light is inclined in accordance with the mark patterns of the reticle, detection can be executed in accordance with the same principle. Tilting the illumination light in accordance with the mark pattern of the reticle 1 means that, with the position on the reticle 1 to be illuminated, the position or shape of the effective light source at the pupil of the optical system is different.

Figure 5:
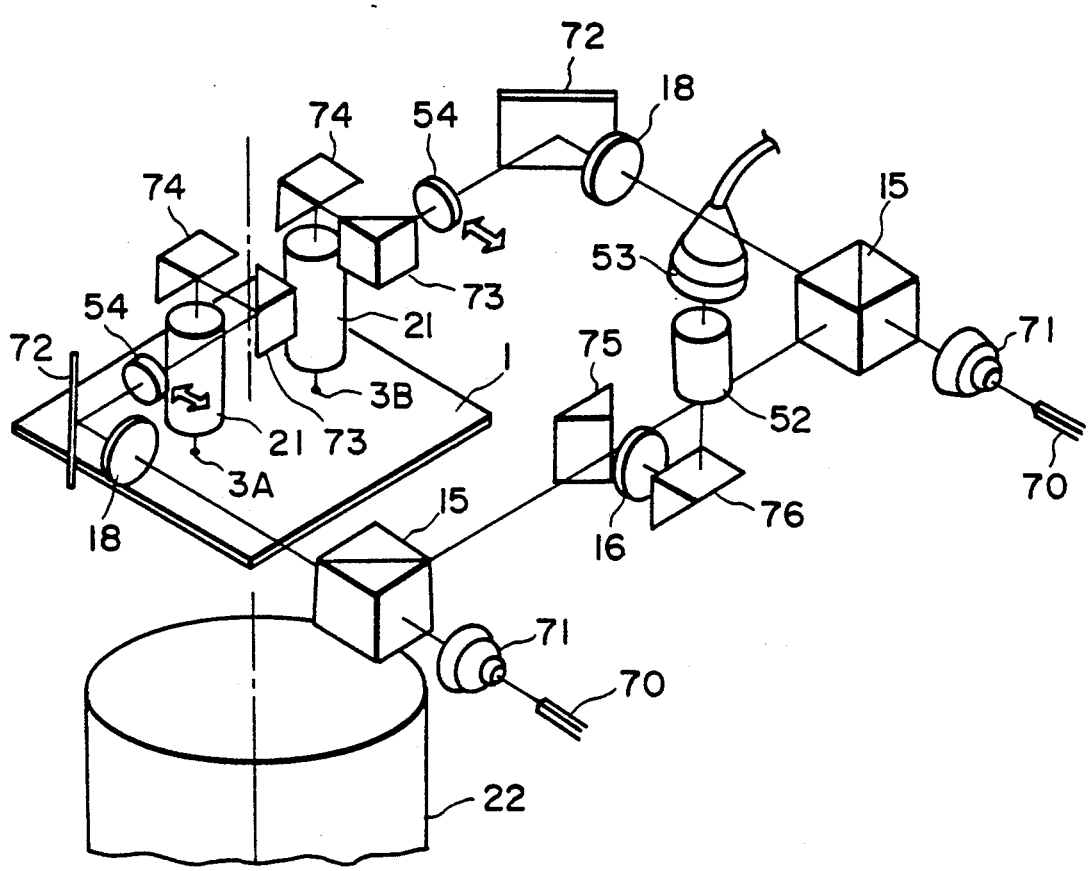
FIG. 5 is a schematic view showing a major portion of a deviation detecting system according to another embodiment of the present invention.

FIG. 5 shows another embodiment of the present invention. This embodiment uses an illumination system having fibers 70, in place of a scan type illumination system using a deflector such as a rotatable polygonal mirror. In FIG. 5, the elements corresponding to those shown in FIGS. 1A and 1B are denoted by the same reference numerals. The objective lens 21 and the relay lens 18 are placed in an infinitely corrected relationship, and a quarter waveplate 54 is inserted into or retracted out of the path between the lenses 21 and 18. When, as described with reference to the foregoing embodiments, the deviation of the image of the mark pattern formed on the image pickup device 53 is to be measured, the point of light emission of the fiber 70 is placed at the position which is in a plane optically conjugate with the pupil plane of the projection lens system 22 and which is eccentric with respect to the center of the pupil of the projection lens system.

The principle of detection of the amount of defocus of the wafer surface with the device of the present embodiment is the same as that of the device shown in FIGS. 1A and 1B. Thus, detail thereof will not be explained to avoid duplication. Only the structure of the optical system illustrated will be explained briefly.

In FIG. 5, denoted at 71 are condenser lenses each for concentrating the light (g-line) from a corresponding fiber 70 and to direct the light to a corresponding polarization beam splitter 15; at 72–74 and 76 are deflecting mirrors; and at 75 is a field combining prism. As illustrated, the present embodiment uses left and right, two series of image forming optical systems to allow detection of left and right mark patterns 3A and 3B of the reticle 1. These optical systems are coupled to a common system (16, 76, 52, 53) by a field dividing prism 75. Thus, both of the images of the mark patterns 3A and 3B can be projected only by the image pickup surface of the image pickup device 53.

When the concepts of measurement of the spacing of the images of plural mark patterns, as described hereinbefore, is to be incorporated into the present embodiment, a stop member may conveniently be provided in the illumination system.

If, as in the embodiment shown in FIGS. 1A and 1B, the projection lens system is aberration-corrected only with respect to the g-line, the present invention is still applicable to a case wherein the state of defocus of the wafer surface is to be detected by using a wavelength different from the g-line. As for such a different wavelength, a laser light from an HeNe laser having a wavelength of 6328 Angstroms may be used. On that occasion, since the projection lens system produces an axial chromatic aberration, the wafer may be initially displaced along the optical axis of the projection lens system, by an amount corresponding to the quantity of the axial chromatic aberration which is of a constant quantity as determined by the projection lens system. Then, the light of the wavelength 6328 Angstroms is used to detect the amount of defocus of the wafer surface, and finally, the wafer may be displaced again along the optical system by an amount corresponding to the sum of the defocus error and the amount of displacement corresponding to the axial chromatic aberration determined by the difference of the wavelength used from the g-line.

As described in the foregoing, by detecting the position of the image of the mark pattern of the reticle formed by the reflection light from the wafer, while using as a reference the position of the image of the mark pattern of the reticle formed by the reflection light from the reticle, it is possible to monitor the shift of the wafer surface from the plane on which the image of the pattern of the reticle is focused.

Also, the present invention assures TTL type surface deviation detection which is desired conventionally. Further, the concepts of the present invention are applicable to the first mask process. Since the focus error of a wafer can be directly calculated by detecting the shift of the image of the mark pattern of the reticle, the optical system and the image pickup device having been used for the detection of alignment marks also can be used for the focus error detection.

While in the foregoing embodiments a specific mark pattern or patterns is provided on the reticle for the detection of any deviation of the wafer surface, an alignment mark or marks formed on the reticle for the reticle-to-wafer alignment may be used for the wafer surface deviation detection. Namely, an image of the alignment mark of the reticle may be picked up by using reflection light from the reticle and reflection light from the wafer, to thereby determine the deviation of the wafer surface.

Also, while the foregoing embodiments have been described with reference to a projection exposure apparatus having a projection lens system, the present invention is applicable also to a projection exposure apparatus having a projection mirror system or a projection system comprising a combination of a lens and a mirror.

Further, while in the foregoing embodiments, the reticle is illuminated from the projection lens system side by using the light reflected by the wafer surface, a mirror having a reflection surface may be provided on the wafer stage, at a position spaced from the zone on which the wafer is to be placed, and by using this mirror, the reticle may be illuminated from the projection lens system side.

Further, the image pickup process for the mark pattern of the reticle is applicable to either one of the dark field detection system and a light field detection system. Also, the present invention is applicable not only to a projection exposure apparatus for the manufacture of semiconductor devices, but also to other types of projection apparatuses.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

a first stage for supporting a first object;

a second stage for supporting a second object;

a projection optical system for projecting an image of the first object onto the second object, said projection optical system having an optical axis and being telecentric both on a side facing the first object and a side facing the second object;

an image pickup system, having a predetermined image pickup surface, for illuminating a mark of the first object with a radiation beam by directing the radiation beam to the mark in a direction inclined with respect to the optical axis of said projection optical system, such that the radiation beam is obliquely projected onto the second object and, with a reflected beam from the first object resulting from the illumination, a first image of the mark of the first object is projected onto said image pickup surface and such that, with a reflected beam from the second object resulting from the illumination and being directed to said image pickup surface through the first object, a second image of the mark of the first object is projected onto said image pickup surface, said image pickup system sequentially projecting the first and second images on said image pickup surface; and detecting means cooperating with said image pickup system, for detecting a deviation, in a direction of the optical axis of said projection optical system, of the surface of the second object from a plane on which the image of the first object is focused, on the basis of any positional deviation between the first and second images projected onto said image pickup surface.

2. An apparatus according to claim 1, wherein the radiation beam is a laser beam.

3. An apparatus according to claim 1, wherein said projection optical system comprises a quarter waveplate and wherein said image pickup system comprises:
   a light source for supplying the radiation beam;
   a polarization beam splitter;
   an objective optical system for receiving the radiation beam from said light source and then from said polarization beam splitter and for directing the received radiation beam to the mark of the first object, said objective optical system directing the reflected beam from the first object and the reflected beam from the second object to said polarization beam splitter so that the first and second images of the mark are projected onto said image pickup surface through said beam splitter; and
   an adjusting device having a demountably insertable quarter waveplate, for adjusting a plane of polarization, said adjusting device being operable to insert and demount the quarter waveplate into and out of said objective optical system, wherein with the insertion and demounting the first and second images of the mark are projected onto said image pickup surface in sequence.

4. An apparatus according to claim 3, wherein said objective optical system comprises a relay lens and an objective lens in the named order from the polarization beam splitter side, said relay lens being telecentric on the objective lens side, said objective lens being telecentric on the relay lens side, and wherein said adjusting device operates to insert the quarter waveplate between said relay lens and said objective lens.

5. An apparatus according to claim 4, wherein said objective lens is telecentric on the first object side.

6. An apparatus according to claim 1, wherein said projection optical system comprises a lens system.

7. An apparatus according to claim 1, wherein said projection optical system comprises a mirror system.

8. An apparatus according to claim 1, wherein said second stage is movable in a direction of the optical axis of said projection optical system and in a direction perpendicular to the optical axis.

9. An apparatus according to claim 8, wherein the first object is a mask having a circuit pattern formed thereon and the second object is a wafer onto which an image of the circuit pattern is projected.

10. An apparatus according to claim 8, wherein the first object is a mask having a circuit pattern formed thereon, and a wafer onto which an image of the circuit pattern is projected is placed on said second stage, and wherein the second object comprises a mirror having a mirror surface and being provided at a position on said second stage, spaced from a position at which the wafer is placed.

11. An apparatus according to claim 8, further comprising driving means for displacing said second stage in the direction of the optical axis, on the basis of detection of the detected by said detecting means.

12. A projection apparatus, comprising:
   a projection optical system for projecting an image of a first object onto a second object, said projection optical system having an optical axis and being telecentric on both its side facing the first object and its side facing the second object;
   an illumination optical system for projecting (i) a first light beam to a first mark of the first object along a first direction inclined with respect to the optical axis of said projection optical system, (ii) a second light beam to a second mark of the first object along a second direction, different from the first direction, inclined with respect to the optical axis of said projection optical system and (iii) the first and second light beams onto the second object obliquely with respect to the optical axis and along different directions;
   image pickup means, having a predetermined image pickup surface, for projecting onto said image pickup surface (i) an image of the first mark having been formed by the first light beam reflected by the second object and then passing through said projection optical system and (ii) an image of the second mark having been formed by the second light beam reflected by the second object and then passing through said projection optical system; and
   detecting means, cooperating with said image pickup means, for detecting a deviation, in a direction of the optical axis of said projection optical system, of the surface of the second object from a plane on which the image of the first object is focused, on the basis of a positional deviation between the first and second mark images projected on said image pickup surface of said image pickup means.

13. An apparatus according to claim 12, wherein said image pickup means comprises (i) means for projecting a third image of the first mark onto said image pickup surface by using a reflection beam caused by reflection of the first light beam by the first object and (ii) means for projecting a fourth image of the second mark onto said image pickup surface by using a reflection beam caused by reflection of the first beam by the first object, and wherein said detecting means comprises means for detecting a relative positional deviation between the first and second mark images on the basis of a relative positional deviation between the third and fourth images.

14. An apparatus according to claim 13, wherein said image pickup means projects the first and second mark images as a pair and the third and fourth images as another pair, in sequence, onto its image pickup surface.

15. A method, usable with first and second objects, for detecting the spacing between the second object and a predetermined plane on which an image of the first objection is focused through a projection optical system having an optical axis and being telecentric on both its side facing the first object and its side facing the second object, said method comprising the steps of:
   projecting (i) a first light beam to a first mark of the first object along a first direction inclined with respect to the optical axis of the projection optical system, (ii) a second light beam to a second mark of the first object along a second direction, different from the first direction, inclined with respect to the optical axis of the projection optical system and (iii) the first and second light beams onto the second object obliquely with respect to the optical axis and along different directions;
   forming on a predetermined image pickup surface (i) an image of the first mark having been formed by the first light beam reflected by the second object and then passing through the projection optical system and (ii) an image of the second mark having been formed by the second light beam reflected by the second object and then passing through the projection optical system; and
   detecting a deviation, in a direction of the optical axis of the projection optical system, of the surface of the second object from a plane on which the image of the first object is focused, on the basis of a positional deviation between the first and second mark images projected on the image pickup surface.

16. A method according to claim 15, further comprising projecting (i) a third image of the first mark onto the image pickup surface by using a reflection beam caused by reflection of the first light beam by the first object, (ii) a fourth image of the second mark onto the image pickup surface by using a reflection beam caused by reflection of the first beam by the first object and (iii) the first and second mark images on the image pickup surface as a pair and the third and fourth images on the image pickup surface as another pair, in sequence, and wherein said detecting step further comprises detecting a relative positional deviation between the first and second mark images on the basis of a relative positional deviation between the third and fourth images.

17. A method of manufacturing semiconductor devices by using a projection exposure apparatus in which an image of a pattern of an original is projected through a projection optical system onto a semiconductor substrate to print an image of the pattern on the semiconductor substrate, the projection optical system having an optical axis and being telecentric on both its side facing the original and its side facing the semiconductor substrate, said method comprising the steps of:

projecting (i) a first light beam to a first mark of the original along a first direction inclined with respect to the optical axis of the projection optical system, (ii) a second light beam to a second mark of the original along a second direction, different from the first direction, inclined with respect to the optical axis of the projection optical system and (iii) the first and second light beams onto the semiconductor substrate obliquely with respect to the optical axis and along different directions;

forming on a predetermined image pickup surface (i) an image of the first mark having been formed by the first light beam reflected by the semiconductor substrate and then passing through the projection optical system and (ii) an image of the second mark having been formed by the second light beam reflected by the semiconductor substrate and then passing through the projection optical system;

detecting a deviation, in a direction of the optical axis of the projection optical system, of the surface of the semiconductor substrate from a plane on which the image of the first object is focused, on the basis of a positional deviation between the first and second mark images projected on the image pickup surface; and adjusting the positional relationship between the predetermined plane and the semiconductor substrate, to project the image of the pattern of the original through the projection optical system onto the semiconductor substrate.

18. A method according to claim 17, further comprising projecting (i) a third image of the first mark onto the image pickup surface by using a reflection beam caused by reflection of the first light beam by the original, (ii) a fourth image of the second mark onto the image pickup surface by using a reflection beam caused by reflection of the first beam by the original and (iii) the first and second mark images on the image pickup surface as a pair and the third and fourth images on the image pickup surface as another pair, in sequence, and wherein said detecting step further comprises detecting a relative positional deviation between the first and second mark images on the basis of a relative positional deviation between the third and fourth images.

* * * * *